United States Patent
Hey et al.

(10) Patent No.: US 6,808,612 B2
(45) Date of Patent: Oct. 26, 2004

(54) METHOD AND APPARATUS TO OVERCOME ANOMALIES IN COPPER SEED LAYERS AND TO TUNE FOR FEATURE SIZE AND ASPECT RATIO

(75) Inventors: Peter Hey, Sunnyvale, CA (US); Byung-Sung Leo Kwak, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 434 days.

(21) Appl. No.: 09/853,962

(22) Filed: May 10, 2001

(65) Prior Publication Data

US 2002/0011415 A1 Jan. 31, 2002

Related U.S. Application Data

(60) Provisional application No. 60/206,500, filed on May 23, 2000.

(51) Int. Cl.[7] ................................................. C25D 5/18
(52) U.S. Cl. ...................... 205/104; 205/103; 205/123; 205/157; 205/799
(58) Field of Search .............................. 205/103, 104, 205/123, 157, 799

(56) References Cited

U.S. PATENT DOCUMENTS

| | | | |
|---|---|---|---|
| 2,742,413 A | 4/1956 | Cransberg et al. ............ 204/52 |
| 2,882,209 A | 4/1959 | Brown ........................ 204/52 |
| 3,627,661 A | 12/1971 | Gordon et al. | |
| 3,649,509 A | 3/1972 | Morawetz et al. .......... 204/238 |
| 3,727,620 A | 4/1973 | Orr ............................. 134/95 |
| 3,770,598 A | 11/1973 | Creutz ...................... 204/52 R |
| 4,027,686 A | 6/1977 | Shortes et al. ................ 134/33 |
| 4,065,374 A | 12/1977 | Asami et al. | |
| 4,092,176 A | 5/1978 | Kozai et al. ................ 134/186 |
| 4,110,176 A | 8/1978 | Creutz et al. ............. 204/52 R |
| 4,113,492 A | 9/1978 | Sato et al. ...................... 96/67 |
| 4,120,759 A | 10/1978 | Asami et al. | |
| 4,129,480 A | 12/1978 | Robert | |
| 4,315,059 A | 2/1982 | Raistrick et al. ............ 429/112 |
| 4,326,940 A | 4/1982 | Eckles et al. ............... 204/232 |
| 4,336,114 A | 6/1982 | Mayer et al. ............. 204/52 R |

(List continued on next page.)

FOREIGN PATENT DOCUMENTS

| | | |
|---|---|---|
| DE | 932 709 | 9/1955 |
| EP | 1160846 | 12/2001 |

(List continued on next page.)

OTHER PUBLICATIONS

Holm, Ragnar, "Electric Contacts Theory and Application," Springer–Verlag New York, Inc., New York, New York, 1967, pp. 1–11, 26–31, 40–51, 164–175, and 366–375, (no month given).

(List continued on next page.)

Primary Examiner—Robert R. Koehler
(74) Attorney, Agent, or Firm—Moser, Patterson & Sheridan

(57) ABSTRACT

A method and apparatus for electrochemically depositing a metal into a high aspect ratio structure on a substrate are provided. In one aspect, a method is provided for processing a substrate including positioning a substrate having a first conductive material disposed thereon in a processing chamber containing an electrochemical bath, depositing a second conductive material on the first conductive material as the conductive material is contacted with the electrochemical bath by applying a plating bias to the substrate while immersing the substrate into the electrochemical bath, and depositing a third conductive material in situ on the second conductive material by an electrochemical deposition technique to fill the feature. The bias may include a charge density between about 20 mA*sec/cm$^2$ and about 160 mA*sec/cm$^2$. The electrochemical deposition technique may include a pulse modulation technique.

17 Claims, 3 Drawing Sheets

U.S. PATENT DOCUMENTS

| | | |
|---|---|---|
| 4,376,685 A | 3/1983 | Watson .................... 204/52 R |
| 4,396,467 A | 8/1983 | Anthony ...................... 204/15 |
| 4,405,416 A | 9/1983 | Raistrick et al. ............. 204/68 |
| 4,428,815 A | 1/1984 | Powell et al. .......... 204/297 W |
| 4,435,266 A | 3/1984 | Johnston .................... 204/276 |
| 4,489,740 A | 12/1984 | Rattan et al. ............... 134/140 |
| 4,496,436 A | 1/1985 | Inoue .......................... 204/23 |
| 4,510,176 A | 4/1985 | Cuthbert et al. ............. 427/82 |
| 4,518,678 A | 5/1985 | Allen ......................... 430/311 |
| 4,519,846 A | 5/1985 | Aigo .......................... 134/15 |
| 4,693,805 A | 9/1987 | Quazi .................... 204/192.22 |
| 4,732,785 A | 3/1988 | Breser ....................... 427/240 |
| 4,789,445 A | 12/1988 | Goffman et al. ............ 204/114 |
| 4,869,971 A | 9/1989 | Nee et al. .................... 428/635 |
| 4,891,106 A | 1/1990 | Domnikov ................... 204/30 |
| 4,898,647 A | 2/1990 | Luce et al. |
| 5,039,381 A | 8/1991 | Mullarkey ................ 204/47.5 |
| 5,055,425 A | 10/1991 | Leibovitz et al. ........... 437/195 |
| 5,092,975 A | 3/1992 | Yamamura et al. ......... 204/198 |
| 5,155,336 A | 10/1992 | Gronet et al. ................ 219/411 |
| 5,162,260 A | 11/1992 | Leibovitz et al. ........... 437/195 |
| 5,178,813 A | 1/1993 | Akatsu et al. ........... 264/210.7 |
| 5,222,310 A | 6/1993 | Thompson et al. ........... 34/202 |
| 5,224,504 A | 7/1993 | Thompson et al. ......... 134/155 |
| 5,230,743 A | 7/1993 | Thompson et al. ........... 134/32 |
| 5,252,807 A | 10/1993 | Chizinsky ................... 219/390 |
| 5,256,274 A | 10/1993 | Poris .......................... 205/123 |
| 5,259,407 A | 11/1993 | Tuchida et al. ............. 134/151 |
| 5,290,361 A | 3/1994 | Hayashida et al. ............ 134/2 |
| 5,302,256 A | 4/1994 | Miura et al. .................. 205/85 |
| 5,316,974 A | 5/1994 | Crank ........................ 437/190 |
| 5,328,589 A | 7/1994 | Martin ....................... 205/296 |
| 5,349,978 A | 9/1994 | Sago et al. .................. 134/153 |
| 5,368,711 A | 11/1994 | Poris .......................... 204/193 |
| 5,377,708 A | 1/1995 | Bergman et al. ............ 134/105 |
| 5,384,640 A | 1/1995 | Wong ......................... 356/437 |
| 5,415,890 A | 5/1995 | Kloiber et al. .............. 427/242 |
| 5,429,733 A | 7/1995 | Ishida ..................... 204/224 R |
| 5,447,615 A | 9/1995 | Ishida ..................... 204/224 R |
| 5,454,930 A | 10/1995 | Miura et al. ................ 205/159 |
| 5,516,412 A | 5/1996 | Andricacos et al. .... 204/224 R |
| 5,516,414 A | 5/1996 | Glafenhein et al. |
| 5,528,118 A | 6/1996 | Lee ....................... 318/568.17 |
| 5,608,943 A | 3/1997 | Konishi et al. ............... 15/302 |
| 5,625,170 A | 4/1997 | Poris .......................... 177/50 |
| 5,651,865 A | 7/1997 | Sellers .................. 204/192.13 |
| 5,670,034 A | 9/1997 | Lowery |
| 5,705,223 A | 1/1998 | Bunkofske ................. 427/240 |
| 5,723,028 A | 3/1998 | Poris .......................... 204/231 |
| 5,730,890 A | 3/1998 | Bickford et al. .............. 216/87 |
| 5,838,121 A | 11/1998 | Fairbairn et al. ............. 318/45 |
| 5,885,469 A | 3/1999 | Kholodenko et al. ......... 216/11 |
| 6,024,856 A | 2/2000 | Haydu et al. ................. 205/84 |
| 6,071,388 A | 6/2000 | Uzoh ..................... 204/297 R |
| 6,074,544 A | 6/2000 | Reid et al. ................... 205/157 |
| 6,093,291 A | 7/2000 | Izumi et al. ............ 204/224 R |
| 6,113,771 A | 9/2000 | Landau et al. .............. 205/123 |
| 6,133,061 A | 10/2000 | Sonoda |
| 6,162,344 A | 12/2000 | Reid et al. |
| 6,174,425 B1 | 1/2001 | Simpson et al. .............. 205/96 |
| 6,197,181 B1 | 3/2001 | Chen .......................... 205/123 |
| 6,203,582 B1 | 3/2001 | Berner et al. .............. 29/25.01 |
| 6,203,684 B1 | 3/2001 | Taylor et al. ................ 205/103 |
| 6,210,555 B1 | 4/2001 | Taylor et al. ................ 205/103 |
| 6,224,737 B1 | 5/2001 | Tsai et al. ................... 205/123 |
| 6,227,263 B1 | 5/2001 | Kust et al. .................... 141/86 |
| 6,251,236 B1 | 6/2001 | Stevens ................. 204/224 R |
| 6,254,760 B1 | 7/2001 | Shen et al. .................. 205/335 |
| 6,258,220 B1 | 7/2001 | Dordi et al. ................. 204/198 |
| 6,261,433 B1 | 7/2001 | Landau ........................ 205/96 |
| 6,261,733 B1 | 7/2001 | Coppens et al. ............. 430/230 |
| 6,267,853 B1 | 7/2001 | Dordi et al. ................. 204/232 |
| 6,277,263 B1 | 8/2001 | Chen et al. .................. 205/182 |
| 6,290,833 B1 | 9/2001 | Chen .......................... 205/182 |
| 6,303,014 B1 | 10/2001 | Taylor et al. ................ 205/103 |
| 6,319,384 B1 | 11/2001 | Taylor et al. ................ 205/103 |
| 6,340,633 B1 | 1/2002 | Lopatin et al. .............. 438/625 |
| 6,344,419 B1 | 2/2002 | Forster et al. ............... 438/758 |
| 6,349,633 B1 | 2/2002 | Inakuma et al. |
| 6,350,366 B1 | 2/2002 | Landau et al. .............. 205/182 |
| 6,391,166 B1 | 5/2002 | Wang ..................... 204/224 R |
| 6,395,101 B1 | 5/2002 | Scranton et al. .............. 134/32 |
| 6,399,479 B1 | 6/2002 | Chen et al. .................. 438/628 |
| 6,409,903 B1 | 6/2002 | Chung et al. .................. 205/96 |
| 6,423,636 B1 * | 7/2002 | Dordi et al. ................. 438/678 |
| 6,432,821 B1 | 8/2002 | Dubin et al. ................. 438/678 |
| 6,432,832 B1 | 8/2002 | Miller et al. ................. 438/713 |
| 6,440,291 B1 | 8/2002 | Henri et al. .................. 205/205 |
| 6,551,484 B2 | 4/2003 | Hey et al. ..................... 205/96 |
| 6,551,488 B1 | 4/2003 | Hey et al. ................... 205/157 |
| 6,565,729 B2 | 5/2003 | Chen et al. ................... 205/82 |
| 6,632,345 B1 | 10/2003 | Chen .......................... 205/182 |
| 6,638,410 B2 | 10/2003 | Chen et al. .................. 205/182 |
| 2001/0015321 A1 | 8/2001 | Reid et al. ................... 205/103 |

FOREIGN PATENT DOCUMENTS

| | | | |
|---|---|---|---|
| JP | 52056369 | 5/1977 | |
| JP | 58182823 | 10/1983 | ......... H01L/21/288 |
| JP | 63118093 | 5/1988 | ............ C25D/5/18 |
| JP | 04280993 | 10/1992 | ............ C25D/5/18 |
| JP | 6-17291 | 1/1994 | ......... H01L/21/288 |
| JP | 4-141395 | 5/1994 | ............ C25D/5/34 |
| JP | 53086580 | 7/1998 | ......... H01L/21/302 |
| SU | 443 108 | 11/1968 | |
| WO | WO 97/12079 | 4/1997 | ............ C25D/5/02 |
| WO | 99/25902 | 5/1999 | .......... C25B/13/00 |
| WO | 99/25903 | 5/1999 | ............ C25D/5/00 |
| WO | 99/25904 | 5/1999 | ............ C25D/5/02 |
| WO | WO 99/25905 | 5/1999 | ............ C25D/5/02 |
| WO | 99/25905 | 5/1999 | ............ C25D/5/02 |
| WO | 99/26275 | 5/1999 | |
| WO | 99/47731 | 9/1999 | ............ C25D/3/58 |
| WO | 99/54527 | 10/1999 | .......... C25D/17/00 |
| WO | 01/90446 | 11/2001 | |

OTHER PUBLICATIONS

Pitney, K.E., NEY Contact Manual, "Electrical Contacts for Low Energy Uses," The J. M. Ney Co., Bloomfield, Conneticut, 1973, pp. 1–13, 88–91, and 148–165, (no month given).

U.S. patent application Ser. No. 09/245,780, Dordi et al., filed Feb. 5, 1999.

U.S. patent application Ser. No. 09/614,407, Zheng et al., filed Jul. 12, 2000.

U.S. patent application Ser. No. 09/569,833, Gandikota et al., filed May 11, 2000.

Singer, Peter, "Wafer Processing," Semiconductor International, Jun. 1998, p. 70.

Singer, Peter, "Tantalum, Copper and Damascene: The Future of Interconnects," Semiconductor International, Jun. 1998, pp. 90–91, 94–96, and 98.

Dordi, et al. "Flow Diffuser to be Used in Electro–Chemical Plating System," filed Dec. 5, 2000; USSN 09/731,326.

Hey, et al. "Deposition Uniformity Control for Electroplating Apparatus, and Associated Method," filed Oct. 12, 2000; USSN 09/687,053.

Olgado, "Linear Motion Apparatus and Associated Method," filed Oct. 16, 2000; USSN 09/684,500.

Dordi, et al. "Method and Associated Apparatus for Tilting a Substrate Upon Entry for Metal Deposition," filed Oct. 3, 2000; USSN 09/678,947.

Olgado, et al. "Stable Cell Platform," filed Sep. 29, 2000; USSN 09/676,362.

Olgado, et al. "Multiple Blade Robot Adjustment Apparatus and Associated Method," filed Sep. 18, 2000; USSN 09/664,607.

Olgado, "Removable Modular Cell for Electro–Chemical Plating," filed Sep. 15, 2000; USSN 09/663,814.

Zheng, et al. "Method of Application of Electrical–biasing to Enhance Metal Deposition," filed Jul. 12, 2000; USSN 09/614,407.

Gandikota, et al. "Electrochemical Deposition for High Aspect Ratio Structures Using Electrical Pulse Modulation," filed May 11, 2000; USSN 09/569, 833.

Dordi, et al. "Electrodeposition Chemistry for Improved Filling of Apertures," filed Feb. 5, 1999; USSN 09/245,780.

Colombo, "Wafer Back Surface Film Removal," Central R&D, SGS–Thomson Microelectronics, Agate Italy.

Semitool Product Catalog (on–line) October 27, 1998.

Singer, "Copper Has Enormous Benefits When Compared to Aluminum, but its Implementation Requires Some Fundamental Changes in Process Technologies," Semiconductor International Jun. 1998.

Singer, "Wafer Processing," Semiconductor International Jun. 1998.

Pitney, "Ney Contact Manual" Oct. 1974.

Holm, "Electric Contacts: Theory and Application" Aug. 21, 1967.

International Search Report for PCT Application US01/15200 dated Mar. 11, 2003. (AMAT/4582.PC).

International Search Report for PCT Application US99/08782 dated Jan. 31, 2000. (AMAT/2601.02.SP).

U.S. patent application for 09/614,407, filed on Jul. 11, 2000. (AMAT/4471.Y1).

PCT Written Opinion for PCT US01/15200, dated Feb. 5, 2004 (AMAT/4582.PC).

Frederick A. Lowenheim, "Electrical Relationships"; Electroplating, McGraw–Hill Book Company, Scientific Library, Jan. 1979 pp. 12–13.

Singer, P., "Tantalum, Copper and Damascene: The Future of Interconnects," Semiconductor International, Jun. 1998, 6 pages.

* cited by examiner

METHOD AND APPARATUS TO OVERCOME ANOMALIES IN COPPER SEED LAYERS AND TO TUNE FOR FEATURE SIZE AND ASPECT RATIO

CROSS-REFERENCE TO RELATED APPLICATIONS

This application claims benefit of U.S. provisional patent application Ser. No. 60/206,500, filed May 23, 2000, which is herein incorporated by reference.

BACKGROUND OF THE INVENTION

1. Field of the Invention

The present invention relates to electrochemical deposition or electroplating of a metal onto a substrate. More particularly, the invention relates to a method for electrochemical deposition of a metal into high aspect ratio structures on a substrate.

2. Background of the Related Art

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines, dual damascenes, and other features. Reliable formation of these interconnect features is very important to the success of ULSI and to the continued effort to increase circuit density and quality on individual substrates and die.

As circuit densities increase, the widths of vias, contacts, dual damascenes, and other features, as well as the dielectric materials between them, decrease to less than 250 nanometers, whereas the thickness of the dielectric layers remains substantially constant, with the result that the aspect ratios for the features, i.e., their height divided by width, increases. Many traditional deposition processes, such as physical vapor deposition (PVD) and chemical vapor deposition (CVD), have difficulty filling structures, such as dual damascenes, where the aspect ratio exceed 4:1, and particularly where it exceeds 10:1. Therefore, there is a great amount of ongoing effort being directed at the formation of void-free, nanometer-sized features having high aspect ratios wherein the ratio of feature height to feature width can be 4:1 or higher. Additionally, as the feature widths decrease, the device current remains constant or increases, which results in an increased current density in the feature.

Currently, copper and its alloys have become the metals of choice for sub-quarter-micron interconnect technology because copper has a lower resistivity than aluminum, (1.7 $\Omega$-cm compared to 3.1 $\Omega$-cm for aluminum), and a higher current carrying capacity and significantly higher electromigration resistance. These characteristics are important for supporting the higher current densities experienced at high levels of integration and increased device speed. Further, copper has a good thermal conductivity and is available in a highly pure state.

Despite the desirability of using copper for semiconductor device fabrication, choices of fabrication methods for depositing copper into very high aspect ratio features, such as a 4:1 aspect ratio via having a width of $0.35\mu$ or less, are limited. As a result of these process limitations, electroplating, which had previously been limited to the fabrication of lines on circuit boards, is just now being used to fill vias and contacts on semiconductor devices.

Electroplating processes deposit a material on a conductive surface by the chemical reduction of metal ions in a chemical solution by the application of an external electrical current. However, electroplating processes require a conductive surface, such as a conductive barrier layer being deposited on a substrate surface prior to electroplating. The conductive barrier layer may be deposited by physical vapor deposition techniques or chemical vapor deposition techniques. Additionally, such barrier layer materials as titanium, tantalum and nitrides thereof, often do not provide a sufficiently conductive surface for deposition and a "seed" layer is deposited to provide adequate nucleation of an electroplating layer.

Electroplating processes typically require the electrically conductive nucleation, or seed, layer, to be thin and conformally deposited on the substrate to provide a surface on the substrate to adequately initiate the electroplating process. The seed layer typically comprises a conductive metal, such as copper, and is conventionally deposited on the substrate using physical vapor deposition (PVD) or chemical vapor deposition (CVD) techniques. It has been found that conformal deposition of the seed layer results in good electroplating of the substrate. However, as feature sizes decrease, the ability to deposit conformal seed layers can be compromised.

For example, the thin seed layer may not be deposited uniformly on the substrate. Uneven deposition of the seed layer can result in layer agglomeration or create a discontinuous layer over portions of the substrate and in the features formed on the substrate. Non-uniform deposition and agglomeration of the seed layer can result in a current that is not evenly distributed over the surface of the seed layer and may result in non-uniform deposition of subsequent electrochemical deposited layers on the substrate. The non-uniform deposition of subsequent layers has been observed to be detrimental to circuit uniformity, conductivity, and reliability. Furthermore, the non-uniformity and agglomeration of the seed layer may also reduce the effective adhesion of conductive material, such as copper, to the substrate and reduces the ability of subsequent layers to adequately bond to the conductive material.

FIG. 1 illustrates discontinuous and agglomeration defects from non-uniform deposition of a seed layer in a high aspect ratio feature 106 on a substrate 100. Agglomerations 102 can form in feature 106 due to excess deposition of conductive materials, such as copper, on the sidewalls or bottom of the feature. The agglomeration may be extensive enough to "bridge" over a section of the feature 106 during subsequent deposition processes, such as electroplating, and form a void (not shown) inside the feature 106. Additionally, discontinuities, such as voids 104 can form on the sidewalls and bottom of the feature 106 from non-uniform current densities. The discontinuities may detrimentally affect subsequent processing, such as by interfering with the application of uniform current densities along the feature surface during subsequent electroplating processes. This lack of uniform current densities on the seed layer may result in the formation of voids (not shown) on the sidewalls and bottoms of features in material deposited by electroplating processes.

Formation of voids and other filling defects in substrate structures from non-uniform or agglomerated layers is further compounded as the industry transitions from manufacturing 200 mm substrates to 300 mm substrates, where the variation in the uniformity of the deposited material can be greater. In electroplating copper films on 300 mm substrates, it has been observed that the uniformity of thin metal layers, such as seed layers used in electroplating processes, can be quite variable and the continuity of the thin metal layer is uncertain in the features at the edges of the substrate and in the high aspect ratios formed therein, thereby leading to an increase in void formation and other defects in filling substrates.

Additionally, deposited seed layers may become damaged during the plating process, and thereby form defects, which can detrimentally affect additional plating of material into the feature. For example, in conventional plating processes, a substrate is submerged into an electroplating bath and then power is applied to the substrate to deposit material thereon. However, the depositing material may dislodge portions of the seed layer, or etch portions of the seed layer, from the substrate surface, which loss of seed layer material may result in forming defects, such as discontinuities. Also, thin seed layers can be "deplated" from the substrate surface during the application of the initial pulse of pulse plating techniques, which use alternating voltages or currents to deposit and dissolve materials from a substrate surface to produce conformal depositions.

Therefore, there is a need for a method for electrochemical deposition of a metal into high aspect ratio structures on a substrate that provides void-free or seam-free fill of high aspect ratio structures. Ideally, the method for electrochemical deposition of metal would be effective for substrates of various sizes, and effective for deposition of metal at the edges of the substrate and in the high aspect ratios formed therein.

SUMMARY OF THE INVENTION

Aspects of the invention generally provide a method for electrochemical deposition of a conductive material into high aspect ratio structures on a substrate that reduces or minimizes the effect of seed layer defects, such as layer non-uniformity and discontinuities, and minimizes or reduces material agglomeration during filling of the feature. In one aspect of the invention, a method is provided for processing a substrate including positioning a substrate having a first conductive material disposed thereon in a processing chamber containing an electrochemical bath, depositing a second conductive material on the first conductive material as the conductive material is contacted with the electrochemical bath by applying a plating bias to the substrate while immersing the substrate into the electrochemical bath, and depositing a third conductive material in situ on the second conductive material by an electrochemical deposition technique to fill the feature.

Another aspect of the invention provides a method for electrochemically depositing a conductive material into a high aspect ratio structure on a substrate including depositing a seed layer in the high aspect ratio structure on the substrate, applying a plating bias over the substrate by exposing the substrate to a charge density between about 20 mA*sec/cm$^2$ and about 160 mA*sec/cm$^2$ while immersing the substrate into an electrochemical bath to deposit a patching layer in the high aspect ratio structure, and depositing a conductive material on the patching layer in situ to fill the high aspect ratio structure.

Another aspect of the invention provides a method for filling a high aspect ratio structure on a substrate in an electrochemical bath including providing a substrate having discontinuous conductive layers formed thereon, reducing the formation of discontinuous conductive layers and minimizing agglomeration of subsequently deposited conductive material while immersing the substrate into the electrochemical bath, and filling the high aspect ratio structure with a conductive material.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention will be described below in reference to an electrochemical deposition process performed in an electrochemical deposition cell, such as the Electra™ Cu ECP system, available from Applied Materials, Inc., Santa Clara, Calif. A detailed description of an electrochemical deposition system is provided in commonly assigned and co-pending U.S. patent application Ser. No. 09/289,074, entitled "Electrochemical Deposition System", filed on Apr. 8, 1999, which is incorporated by reference herein to the extent not inconsistent with the specification and claims of the invention.

Figure 2:
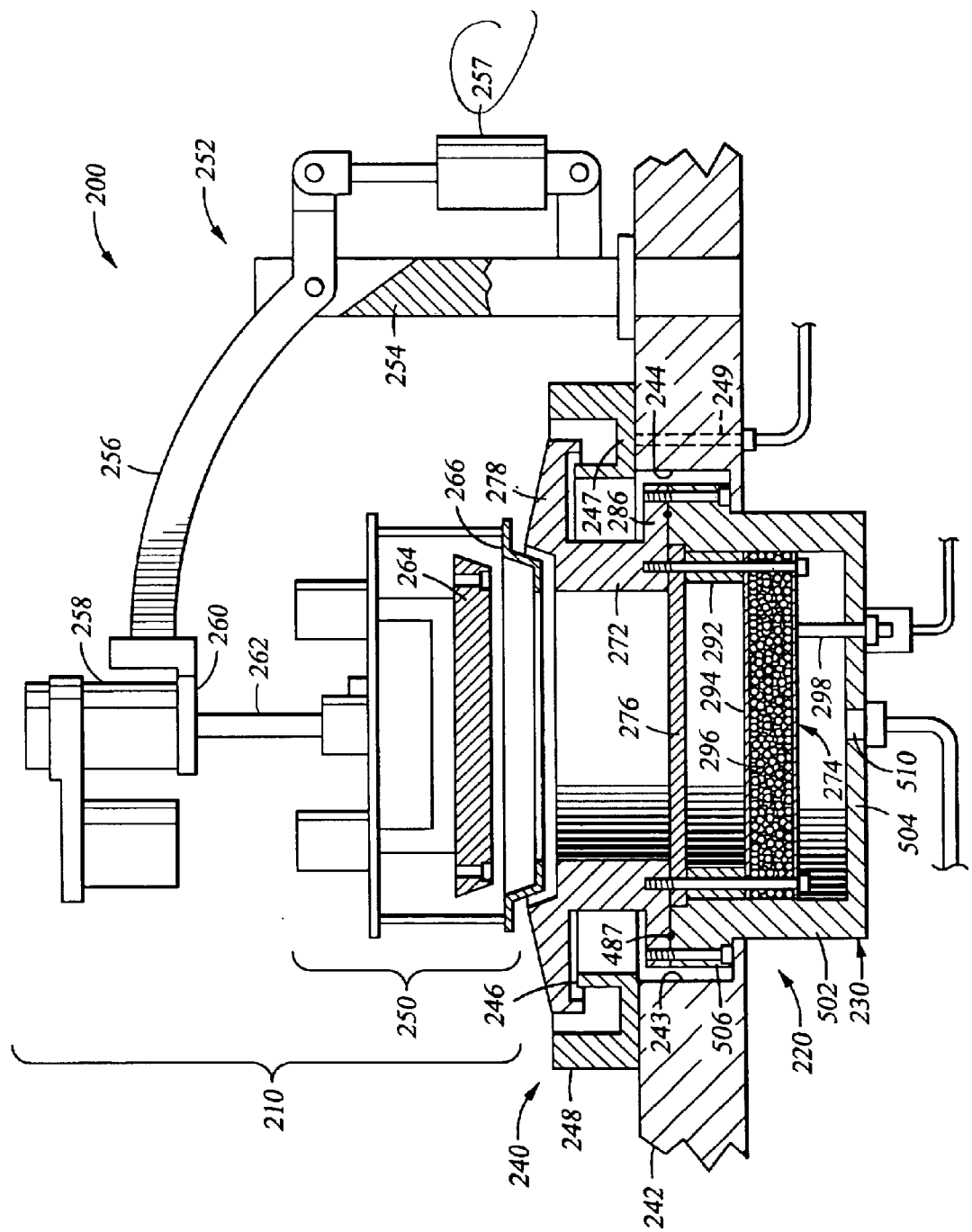
FIG. 2 is a schematic perspective view of a electrochemical deposition cell.

FIG. 2 is a cross sectional view of one embodiment of an electroplating process cell 200 that can be used to deposit the conductive materials. The processing cell 200 generally includes a head assembly 210, a process kit 220 and an electrolyte collector 240. In one embodiment, the electrolyte collector 240 is secured onto the body 242 over an opening 243 that defines the location for placement of the process kit 220. The electrolyte collector 240 includes an inner wall 246, an outer wall 248 and a bottom 247 connecting the walls. An electrolyte outlet 249 is disposed through the bottom 247 of the electrolyte collector 240 and connected to the electrolyte replenishing system (not shown) through tubes, hoses, pipes or other fluid transfer connectors.

The head assembly 210 is mounted onto a head assembly frame 252. The head assembly frame 252 includes a mounting post 254 and a cantilever arm 256. The mounting post 254 is mounted onto the body 242, and the cantilever arm 256 extends laterally from an upper portion of the mounting post 254. Preferably, the mounting post 254 provides rotational movement with respect to a vertical axis along the mounting post to allow rotation of the head assembly 210.

The head assembly 210 is attached to one end of the cantilever arm 256. The lower end of the cantilever arm 256 is connected to a cantilever arm actuator 257, such as a pneumatic cylinder, mounted on the mounting post 254. The cantilever arm actuator 257 provides pivotal movement of the cantilever arm 256 with respect to the joint between the cantilever arm 256 and the mounting post 254. When the cantilever arm actuator 257 is retracted, the cantilever arm 256 moves the head assembly 210 away from the process kit 220 to provide the spacing required to remove and/or replace the process kit 220 from the electroplating process cell 200. When the cantilever arm actuator 257 is extended, the cantilever arm 256 moves the head assembly 210 toward the process kit 220 to position the substrate in the head assembly 210 in a processing position.

The head assembly 210 generally includes a substrate holder assembly 250 and a substrate assembly actuator 258. A substrate assembly actuator 258 is mounted onto a mounting plate 260, and includes a head assembly shaft 262 extending downwardly through the mounting plate 260. The lower end of the head assembly shaft 262 is connected to the substrate holder assembly 250 to position the substrate holder assembly 250 in a processing position and in a substrate loading position. The substrate holder assembly 250 generally includes a substrate holder 264 and a cathode contact ring 266.

In one embodiment, the cathode contact ring 266 includes a conductive metal or a metal alloy, such as stainless steel, copper, silver, gold, platinum, titanium, tantalum, and other conductive materials, or a combination of conductive materials, such as stainless steel coated with platinum. The cathode contact ring 266 includes an upper mounting portion (not shown) adapted for mounting the cathode contact ring onto the substrate holder assembly and a lower substrate receiving portion (not shown) adapted for receiving a substrate therein. The substrate receiving portion includes an annular substrate seating surface (not shown) having a plurality of contact pads or bumps disposed thereon and preferably evenly spaced about the circumference of the seating surface. When a substrate is positioned on the substrate seating surface, the contact pads physically contact a peripheral region of the substrate to provide electrical contact to the electroplating seed layer on the substrate deposition surface. Preferably, the contact pads are coated with a noble metal, such as platinum or gold, that is resistant to oxidation.

Other contact ring designs are useful in the electroplating processing cell according to the invention, such as the contact ring designs described in commonly assigned and co-pending U.S. patent application Ser. No. 09/201,486 entitled "Cathode Contact Ring For Electrochemical Deposition", filed on Nov. 30, 1998, which is incorporated by reference to the extent not inconsistent with the invention as claimed and described herein.

The substrate holder 264 is preferably positioned above the cathode contact ring 266 and includes a bladder assembly (not shown) that provides pressure to the backside of a substrate and ensures electrical contact between the substrate plating surface and the cathode contact ring 266.

Referring back to FIG. 2, a cross sectional view of an electroplating process cell 200, the substrate holder assembly 250 is positioned above the process kit 220. The process kit 220 generally includes a bowl 230, a container body 272, an anode assembly 274 and a filter 276. The container body 272 is preferably a cylindrical body composed of an electrically insulative material, such as ceramic, plastic, Plexiglas (acrylic), Lexane, PVC, CPVC, and PVDF or a metal, such as stainless steel, nickel and titanium, which is coated with an insulating layer, such as Teflon, PVDF, plastic, rubber and other combinations of materials that do not dissolve in the electrolyte and can be electrically insulated from the electrodes (i.e., the anode and cathode of the electroplating system). The container body 272 is preferably sized and adapted to conform to the substrate plating surface and the shape of a substrate being processed through the system, typically circular or rectangular in shape.

An upper portion of the container body 272 extends radially outwardly to form an annular weir 278. The weir 278 extends over the inner wall 246 of the electrolyte collector 240 and allows the electrolyte to flow into the electrolyte collector 240. The upper surface of the weir 278 preferably corresponds to the lower surface of the cathode contact ring 266. When a substrate is positioned in the processing position, the substrate plating surface is positioned slightly below the top of the weir 278. A gap for electrolyte flow is formed between the lower surface of the cathode contact ring 266 and the upper surface of the weir 278.

A lower portion of the container body 272 extends radially outwardly to form a lower annular flange 286 for securing the container body 272 to the bowl 230. Preferably, the filter 276 is attached to and completely covers the lower opening of the container body 272, and the anode assembly 274 is disposed below the filter 276. Preferably, the filter 276 and the anode assembly 274 are fastened to a lower surface of the container body 272 using removable fasteners, such as screws and/or bolts. Alternatively, the filter 276 and the anode assembly 274 are removably secured to the bowl 230. The filter 276 preferably includes a ceramic diffuser configured to control the electrolyte flow pattern toward the substrate plating surface.

The anode assembly 274 preferably includes a consumable anode that serves as a metal source in the electrolyte. Alternatively, the anode assembly 274 includes a non-consumable anode, and the metal to be electroplated is supplied by an electrolyte from an electrochemical bath. The anode assembly 274 is a self-enclosed module having a porous anode enclosure 294 preferably made of the same metal as the metal to be electroplated, such as copper. Alternatively, the anode enclosure 294 is made of porous materials insoluble to the electrolyte, such as ceramics or polymeric membranes. A soluble metal 296, such as high purity copper for electro-chemical deposition of copper, is disposed within the anode enclosure 294. The soluble metal 296 preferably includes metal particles, wires or a perforated sheet. The porous anode enclosure 294 also acts as a filter that keeps the particulates generated by the dissolving metal within the anode enclosure 294.

An anode electrode contact 298 is inserted through the anode enclosure 294 to provide electrical connection to the soluble metal 296 from a power supply. Preferably, the anode electrode contact 298 is made from a conductive material that is insoluble in the electrolyte, such as titanium, platinum and platinum-coated stainless steel. The anode electrode contact 298 extends through the bowl 230 and is connected to an electrical power supply.

The power supply (not shown) is also connected to the cathode contact ring 266 in electrical contact with the substrate. The power supply preferably includes a control circuit that switches between a constant current operation and a constant voltage operation. A control circuit of the power supply controls the polarity of the output. In one embodiment, the power supply includes a switching circuit that is programmable to produce a variety of output waveforms, such as an output waveform including repetitions of a constant current output for a first duration and a constant voltage output for a second duration. The invention contemplates utilizing a variety of power supply designs that are capable of producing such output waveforms and is not limited to any particular power supply design.

The bowl 230 generally includes a cylindrical portion 502 and a bottom portion 504. An upper annular flange 506 extends radially outwardly from the top of the cylindrical portion 502. The upper annular flange 506 of the bowl 230 is fixedly connected with the lower annular flange 286 of the container body 272. The cylindrical portion 502 accommodates the anode assembly 274 and the filter 276. Preferably, the outer dimensions of the filter 276 and the anode assembly 274 are slightly smaller than the inner dimension of the cylindrical portion 502 to force a substantial portion of the electrolyte to flow through the anode assembly 274 first before flowing through the filter 276. The bottom portion 504 of the bowl 230 includes an electrolyte inlet 510 that connects to an electrolyte supply line from an electrolyte replenishing system. The electrolyte inlet 510 and the electrolyte supply line are connected by a releasable connector (not shown) that facilitates easy removal and replacement of the process kit 220.

In operation, a robot (not shown) positions the substrate face down in the substrate holder assembly 250. The substrate is positioned below the substrate holder 264 but above the cathode contact ring 266. The robot then releases the substrate to position the substrate into the cathode contact ring 266. The bladder assembly (not shown) on the substrate holder assembly 250 exerts pressure against the substrate backside to ensure electrical contact between the substrate plating surface and the cathode contact ring 266.

The head assembly 252 is lowered to a processing position above the process kit 220. At this position, the substrate is below the upper plane of the weir 278 and contacts the electrolyte contained in the process kit 220. The power supply is activated to supply electrical power (i.e., voltage and current) to the cathode and the anode to enable the electroplating process. The electrolyte is typically continually pumped into the process kit during the electroplating process. The electrical power supplied to the cathode and the anode and the flow of the electrolyte are controlled by a control system (not shown) to achieve the desired electroplating results. In one embodiment, the head assembly is rotated as the head assembly is lowered and also during the electroplating process.

After the electroplating process has been completed, the head assembly 210 raises the substrate holder assembly 250 and removes the substrate from the electrolyte. In one embodiment, the head assembly is rotated for a period of time to enhance removal of residual electrolyte from the substrate holder assembly. The substrate holder is raised to allow the robot to pick up the processed substrate from the cathode contact ring 266. The robot is moved to a position above the backside of the processed substrate in the cathode contact ring and picks up the substrate. The robot retracts the substrate from the processing cell and transfers the substrate from a face-down position to a face-up position. The substrate may now be transferred for further processing. The above described electrochemical deposition cell is provided for illustrative purposes, and should not be construed or interpreted as limiting the invention.

The Deposition Process

Figure 3:
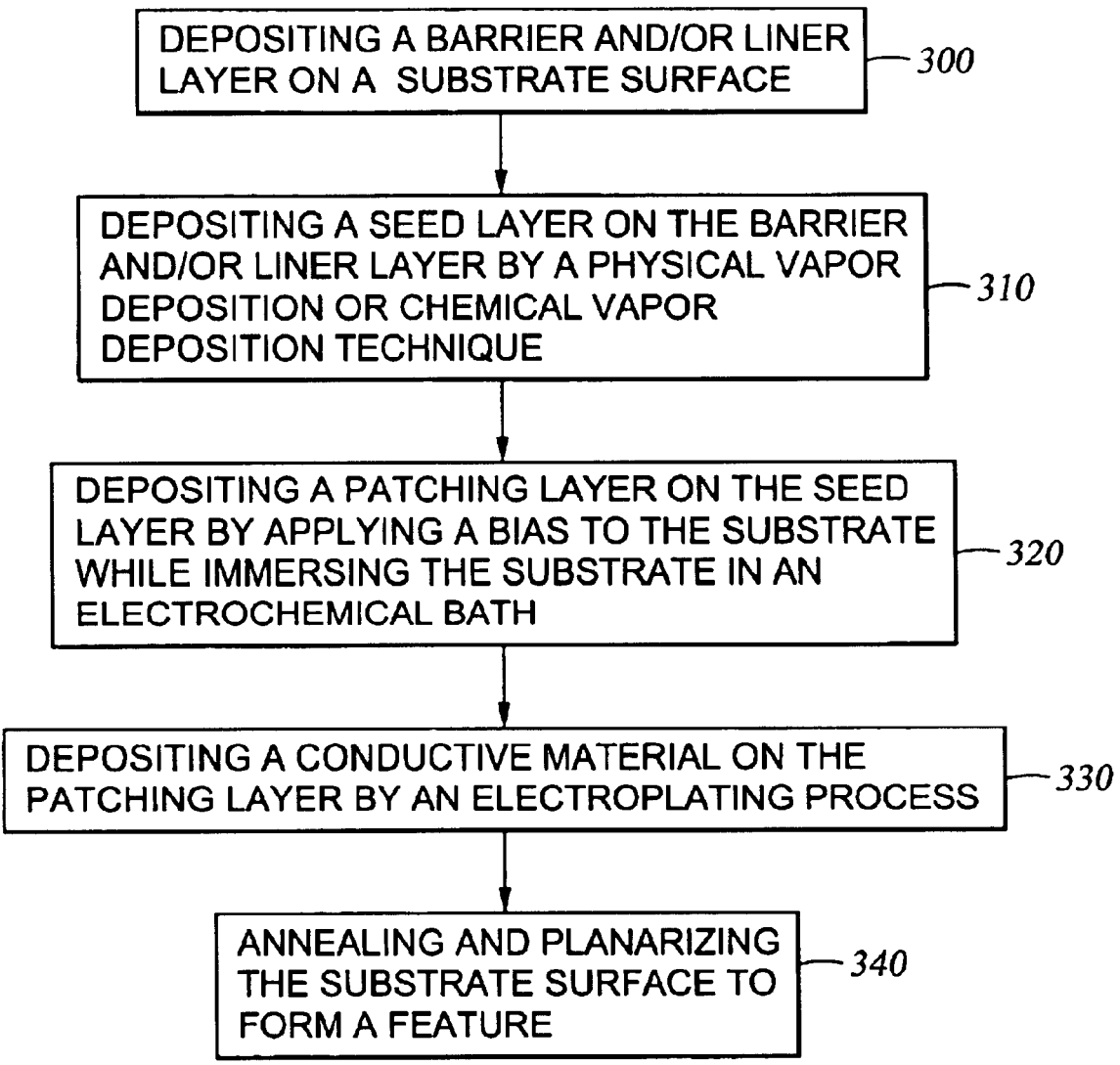
FIG. 3 illustrates one embodiment of the electroplating sequence according to the invention.

FIG. 3 is a flow chart illustrating one embodiment of the electroplating sequence according to the invention. While the following process is described for a 300 mm substrate, the invention is equally applicable and scalable for processing other sized substrates, such as 200 mm substrates.

A patterned substrate is formed by depositing a dielectric layer on the substrate, depositing and patterning a photoresist material on the dielectric layer, and then etching apertures in the dielectric material according to the patterns formed in the photoresist material. The aperture can have a high aspect ratio and can include any structure used in semiconductor manufacturing including vias, lines, and dual damascenes among other structures known in the art.

After etching the dielectric layer, a barrier and/or liner layer may be deposited conformally over the patterned substrate and in the apertures formed therein at Step 300. The barrier and/or liner layer may be deposited by means conventionally known in the art including chemical vapor deposition (CVD) techniques and physical vapor deposition (PVD) techniques, such as ionized metal plasma physical vapor deposition (IMP-PVD), self-ionized physical vapor deposition (SI-PVD), and collimated or long throw sputtering.

Liner and/or barrier layer materials which may be used for copper, aluminum, tungsten, alloys, thereof, and doped derivatives thereof, include, but are not limited to, refractory metals and nitrides of refractory metals (such as tungsten (W), tungsten nitride ($WN_x$), niobium (Nb), aluminum silicates, etc.), tantalum (Ta), tantalum nitride (TaN), titanium nitride (TiN), PVD Ti/$N_2$-stuffed, doped silicon, aluminum, and aluminum oxides, ternary compounds (such as TiSiN, titanium silicon nitride, WSiN, tungsten silicon nitride, etc.), or a combination of these layers. For example, the liner and/or barrier materials may include tantalum (Ta) and tantalum nitride (TaN), which may be deposited individually or sequentially, for copper metallization schemes, and be deposited by IMP-PVD deposition techniques.

A seed layer of a first conductive material is deposited on the barrier and/or liner layer by a chemical vapor deposition (CVD) technique or by physical vapor deposition (PVD) techniques, such as ionized metal plasma PVD (IMP-PVD), at Step 310. A "seed layer" is broadly defined herein as continuously or discontinuously deposited material used to encourage growth of subsequently deposited layers on a substrate surface and to enhance interlayer adhesion of deposited layers.

The first conductive material, the seed layer, includes, but is not limited to, a material selected from the group of copper, nickel, tungsten, and combinations thereof. The first conductive material may also include alloys and doped derivatives of copper, nickel, tungsten, and combinations thereof. Other conducting materials, such as titanium and tantalum among others, that improve the deposition of conductive materials, such as copper, may also be used as the seed layer. The seed layer may further include a doping material selected from a group of phosphorus, boron, indium, tin, beryllium or combinations thereof. The percentage by weight of the doping material is from about 0.01% to about 15%, preferably about 0.01% to about 0.5%.

A patching layer of a second conductive material is then deposited on the seed layer as the seed layer is contacted with the electrochemical bath by applying a plating bias to the substrate during immersion of the substrate in an electroplating bath 320. "Patching layer" is broadly defined herein as deposited material used to reduce the formation of discontinuous layers and to minimize the effect of agglomerated layers on subsequently deposited layers.

The patching layer includes, but is not limited to, a second conductive material selected from the group of copper, nickel, tin, and combinations thereof. The first conductive material may also include alloys of copper, nickel, tungsten, and combinations thereof. The patching layer may include a dopant, such as phosphorus, boron, indium, tin, beryllium, and combinations thereof, which is believed to improve the electromigration properties as well as deposit a more uniform layer with less agglomeration and reduced discontinuations in the layers than compared to non-doped layers. A preferred dopant concentration is between about 0.01% and about 15% by weight (wt. %) of the layer, but preferably between about 0.01 wt. % and about 3 wt. % of the "patching" layer, and most preferably between about 0.01 wt. % and about 0.05 wt. %. In one embodiment, the seed layer and the patching layer include the same conductive metal, of which copper as the seed layer material and the patching layer materials is most preferred.

The bias may be applied when the substrate is in the "tilt" position prior to entry of the substrate into the electrochemical bath and continuously applied during immersion of the substrate in the electrochemical bath. Alternatively, the bias may applied at the moment of contact with the electrochemical bath, the moment of immersion, or may be applied following immersion of the substrate in the electrochemical bath. According to one embodiment of the invention, the bias is applied to the substrate by applying a voltage of between about 0.8 volts and about 20 volts to the substrate. The bias may be applied for a duration between about 0.1 seconds to about 4.0 seconds.

The bias is generally applied at a sufficient voltage and time duration to cause deposition onto the substrate plating surface, including the surfaces of the substrate apertures, prior to beginning the electroplating of a fill layer of material. For example, it has been observed that applying a voltage between about 8 volts and about 20 volts for a period of time between about 0.5 and about 2.0 seconds resulted in the deposition of material sufficient to remove any discontinuities formed in the seed layer and minimize the effect of agglomerations in the seed layer in subsequent depositions by providing a more uniform deposition rate over the seed layer. The patching layer may be deposited to a thickness between about 50 Å and about 250 Å on the seed layer.

The above process parameters were used in depositing conductive materials for a patching layer of a second conductive material by a copper electroplating bath having multi-components including copper electrolyte and additives such as suppressers and brighteners/accelerators. A detailed description of the electroplating chemistry, particularly the composition of the electrolyte and additives, is provided in commonly assigned and co-pending U.S. patent application Ser. No. 09/245,780, entitled "Electrodeposition Chemistry for Improved Filling of Apertures," filed on Feb. 5, 1999, which is incorporated by reference to the extent not inconsistent with the invention as claimed and described herein.

Figure 1:
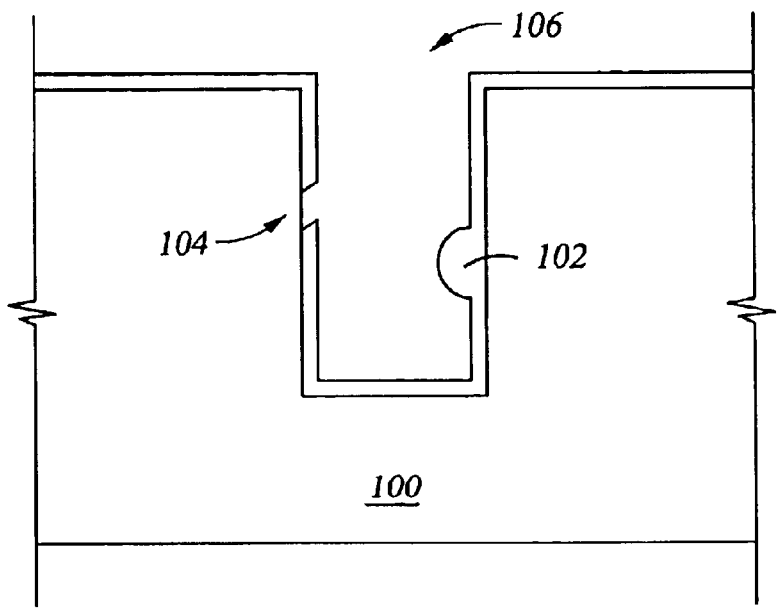
FIG. 1 illustrates defects which may form in a high aspect ratio feature formed on a substrate surface.
Figure 4:
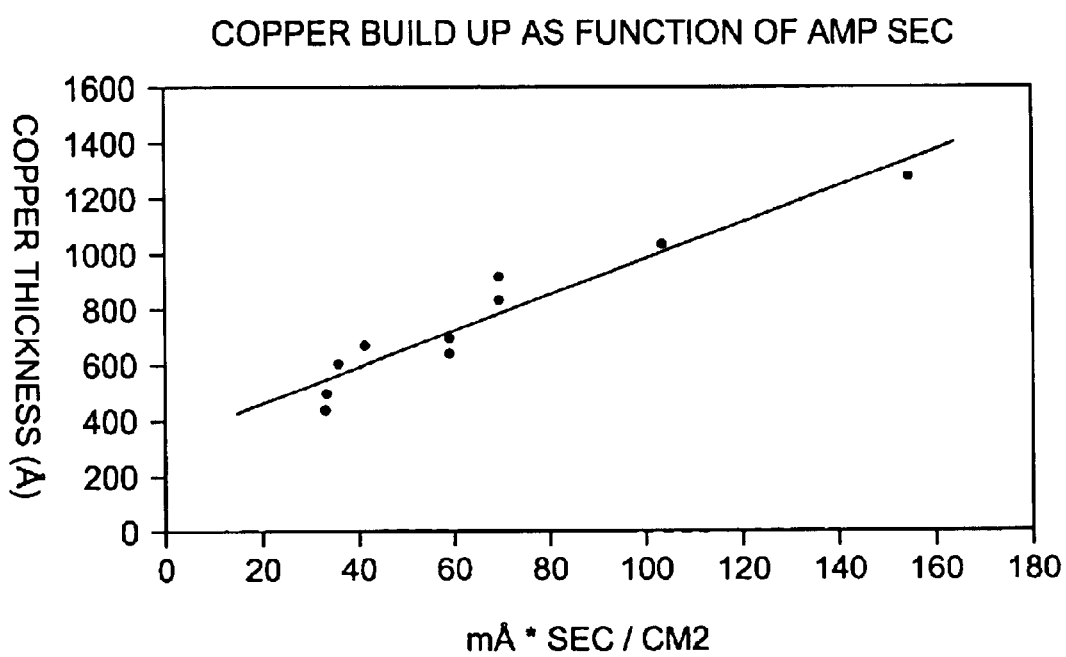
FIG. 4 is a plot of calculated charge density versus layer thickness for a film deposited by one aspect of the process described herein.

The amount of material deposited from the patching layer, or patching layer thickness, can be correlated to the charge density. The charge density is broadly defined herein as the bias applied to the substrate over a period of time per the area of the substrate. The units for charge density units are mA*sec/cm$^2$, where mA is milliamps. The charge density may also be understood as the total charge applied to the substrate over a period of time. The charge density applied to the substrate during deposition of the patching layer was calculated for a given bath having a known resistance and a 300 mm substrate. The charge density was calculated using the formula:

Charge density, $I_d$ (in mA*sec/cm$^2$)=[(time, ($t$), in seconds)(current, ($I$), in amps)]/area of the substrate (cm$^2$), where current, I, is calculated as:

$I$=applied voltage, ($V$), in Volts)/resistance,($R$) in ohms ($\Omega$), and the area is:

$A$=$\pi$(radius of the substrate in cm)$^2$,

An example of calculated results of patching layer thickness for a copper material versus charge density for a 300 mm substrate are represented in FIG. 4.

FIG. 4 is a plot of measured copper thickness versus calculated charge density over a period of time. According to one embodiment of the invention, the bias is applied to the substrate by exposing the substrate to a charge density of between about 20 mA*sec/cm$^2$ and about 160 mA*sec/cm$^2$ to cause deposition onto the substrate plating surface, including the surfaces of the substrate apertures, prior to beginning the electroplating of a fill layer of material. Additionally, the invention contemplates using a charge density less than or greater than the charge densities described above for alternative processes and equipment configurations, such as a charge density of about 5 mA*sec/cm$^2$.

The application of the current density may include conventional methods as well as by the application of an electrical pulse modulation technique. Electrical pulse modulation techniques are broadly defined herein as pulsed voltage or current waveforms which alternatively deposit and remove material from a substrate surface. The electrical pulse modulation technique includes applying a constant current density or voltage over the substrate for a first time period for plating of material onto a substrate surface, than applying a constant reverse current density or voltage over the substrate for a second time period for dissolution, or etching of material from the substrate surface, and repeating the first and second steps to fill the structure. Such techniques have been observed to produce conformal deposition of materials with minimal void formation and agglomeration.

Electrical pulse modulation processes are more fully described in commonly assigned and co-pending U.S. patent application Ser. No. 09/569,833, entitled "Electrochemical Deposition For High Aspect Ratio Structures Using Electrical Pulse Modulation", filed on May 11, 2000, which is incorporated by reference to the extent not inconsistent with the invention as claimed and described herein.

Further, it has been observed that the deposition thickness of the conductive material, such as copper, is about linear with the application of the charge density applied to the substrate. Additionally, the thickness of the copper layer deposited by the process described herein was observed to have increased with increased voltage at a constant time when the bias was applied to the substrate during the immersion process. It was also observed that deposition thickness increased with increased exposure time at a constant voltage when the bias was applied to the substrate during the immersion process.

It is contemplated that this observed linearity of charge density allows the application of an immersion bias to minimize the formations of defects in the seed layer on substrates of various sizes, such as 200 mm substrates, and different seed characteristics as feature dimensions decrease and aspect ratios increase. It is further contemplated that this linear relationship between deposition thickness and charge density will allow for the tuning of deposition process for different sized aspect ratios and modification of recipes used in depositing conductive materials in electrochemical deposition processes to minimize void formation.

A layer of a third conductive material selected from the group of copper, nickel, tungsten, doped derivatives thereof, and combinations thereof, is then deposited by electroplating techniques 330 to fill the apertures. Third conductive material may be deposited in situ with the patching layer in the same electrochemical bath or in the same ECP cell.

The deposition process of the third conductive material may include conventional methods as well as include electrochemical deposition of conductive materials in substrate features by the application of an electrical pulse modulation technique.

For example, the third conductive material may be deposited by application of a constant current density between about 20 mA/cm$^2$ and about 40 mA/cm$^2$ for a duration between about 0.1 second and about 20 seconds, and a reverse current density is then applied for a duration between about 0.02 second and about 3 seconds for fill of high aspect features with minimal or no void formation therein. Alternatively, a voltage between about 15 V and about 25 V is applied for a duration between about 0.1 second and about 20 seconds, and the reverse voltage between about −15 V and about −25 V is then applied for a duration between about 0.02 second and about 3 seconds for fill of high aspect features with minimal or no void formation therein. The immersion bias may form part of the pulse modulation deposition technique.

After the structure has been filled using a pulse modulation process, a constant current density can then be applied over the substrate to deposit a metal layer over the substrate.

After deposition of the third conductive material, the aperture may then be further processed, such as by annealing and/or planarizing the substrate by a chemical mechanical polishing process 440 to form a feature.

It was observed that features filled on a 300 mm substrate using the process described herein had fewer defects and void formations than in features filled without this process. It is believed that the application of a bias allows for limited plating of a metal film during the initial immersion of the plating head and substrate. The plating of the substrate during immersion and/or immediately upon contact of the substrate with the bath will limit the loss of the seed layer to adverse reaction between the seed layer and the electrochemical bath, such as oxidation or wet etching of the seed layer by the bath.

It is further believed that the application of a bias to provide limited plating to the substrate during immersion and/or immediately upon contact of the substrate in the electrochemical bath deposits material that fills defects and discontinuities in the seed layer, minimizes the effects of agglomeration of material of the seed layer by providing relatively uniform deposition rates, and allows subsequent processing, such as electroplating, to provide improved fill of the substrate apertures without substantial voids or deposition defects in the deposited material. Additionally, it is believed that the application of electrical pulse modulation techniques during immersion and/or immediately upon contact of the substrate in the electrochemical bath allows for filling in defects during the plating portion of the cycle and removal of agglomerated materials during the dissolution, or etching, portion of the cycle.

While the foregoing is directed to the preferred embodiment of the present invention, other and further embodiments of the invention may be devised without departing from the basic scope thereof, and the scope thereof is determined by the claims that follow.

What is claimed is:

1. A method for processing a substrate, comprising:
   depositing an electrically conductive seed layer onto a substrate;
   immersing the substrate into plating solution; and
   plating metal ions from the plating solution onto the substrate while immersing the substrate by applying a bias to the substrate at a charge density between about 20 mA*sec/cm$_2$ and about 160 mA*sec/cm$^2$.

2. The method of claim 1, wherein applying a bias to the substrate comprises applying a bias between about 0.8 volts and about 20 volts for a period of time sufficient to compensate for etching of the seed layer by the plating solution while immersing the substrate.

3. The method of claim 2, wherein the bias is applied between about 0.1 seconds and about 4 seconds.

4. The method of claim 1, wherein plating metal ions from the plating solution comprises plating a layer of metal ions onto the seed layer, wherein the layer of metal ions has a thickness of between about 50 Å and about 250 Å.

5. The method of claim 1, wherein the metal ions comprise at least one of copper, nickel, and tungsten.

6. The method of claim 1, wherein applying a bias to the substrate surface comprises applying an increasing bias to the substrate while immersing the substrate.

7. The method of claim 1, wherein applying a bias to the substrate surface comprises applying a pulse modulated bias to the substrate while immersing the substrate.

8. The method of claim 1, wherein plating metal ions from the plating solution comprises plating an alloy layer onto the seed layer.

9. A method for electrochemically plating metal layer onto a substrate surface having high aspect ratio features formed thereon, comprising:
   depositing a seed layer over the substrate surface;
   immersing the substrate surface into an electrochemical plating solution; and
   applying a bias at a charge density of between about 20 mA*sec/cm$^2$ and about 160 mA*sec/cm$^2$ while immersing the substrate surface.

10. The method of claim 9, wherein applying a bias comprises applying an increasing plating bias to the substrate while immersing the substrate or applying a pulse modulated plating bias to the substrate while immersing the substrate surface.

11. The method of claim 9, wherein the bias is applied for a duration of between about 0.5 seconds and about 2 seconds.

12. The method of claim 9, wherein applying a bias comprises applying a bias between about 0.8 volts and about 20 volts to the seed layer for a period of time between about 0.1 second and about 4.0 seconds while immersing the substrate surface.

13. The method of claim 9, further comprising plating a metal layer over the seed layer via an electrochemical plating process after the seed layer is fully immersed in the electrochemical plating solution.

14. The method of claim 13, wherein the metal layer is a metal alloy layer.

15. A method for electrochemically plating a substrate, comprising immersing the substrate into a plating solution while simultaneously applying a charge density of between about 20 mA*sec/cm$^2$ and about 160 mA*sec/cm$^2$, wherein the charge density is applied by applying a bias between about 0.8 volts and about 20 volts to the substrate for a period of between about 0.1 seconds and about 4 seconds.

16. The method of claim 15, wherein the bias causes the deposition of a patching layer over a seed layer formed onto the substrate while immersing the substrate.

17. The method of claim 16, wherein the patching layer comprises a metal alloy layer.

* * * * *

UNITED STATES PATENT AND TRADEMARK OFFICE
CERTIFICATE OF CORRECTION

PATENT NO. : 6,808,612 B2
DATED : October 26, 2004
INVENTOR(S) : Peter Hey and Byung-Sung Leo Kwak It is certified that error appears in the above-identified patent and that said Letters Patent is hereby corrected as shown below:

Title page,
Item [56], References Cited, FOREIGN PATENT DOCUMENTS, add -- DE 932 709 --.

Column 11,
Line 59, add -- a -- after "into".
Line 63, change "20 mA*sec/cm$_2$" to -- 20 mA*sec/cm$^2$ --.

Column 12,
Line 23, add -- a -- after "plating".

Signed and Sealed this

Twenty-eighth Day of June, 2005

JON W. DUDAS
*Director of the United States Patent and Trademark Office*